United States Patent
Donlin et al.

(10) Patent No.: US 7,183,799 B1
(45) Date of Patent: Feb. 27, 2007

(54) PHYSICALLY-ENFORCED TIME-LIMITED CORES AND METHOD OF OPERATION

(75) Inventors: Adam P. Donlin, Los Gatos, CA (US); Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 191 days.

(21) Appl. No.: 11/067,423

(22) Filed: Feb. 25, 2005

(51) Int. Cl.
*H03K 19/173* (2006.01)

(52) U.S. Cl. ............................................. 326/38; 326/8

(58) Field of Classification Search .................. 326/37, 326/38, 8, 9
See application file for complete search history.

(56) References Cited

U.S. PATENT DOCUMENTS

| | | | |
|---|---|---|---|
| 6,173,235 B1 * | 1/2001 | Maeda | 702/58 |
| 6,198,301 B1 * | 3/2001 | Chetlur et al. | 324/769 |
| 2006/0049886 A1 * | 3/2006 | Agostinelli et al. | 331/175 |

OTHER PUBLICATIONS

"The Controversial Bits", Sep. 24, 2004, p. 1 of 1, available from http://people.freenet.de/s.urfer/conditioning.htm.

"Hot Electron Effects", Specific Concerns in Space Applications, Jul. 9, 2004, p. 1 of 1, available from http://nepp/nasa.gov/index_nasa.cfm/909/.

Clement, J.J. et al., "Methodology for Electromigration Critical Threshold Design Rule Evaluation", 2004, p. 1 of 1, available from http://ieeexplore.ieee.org/xpl/abs_free.jsp?arNumber=759073, no month.

Watts, Joe et al., "Hot Electron Degredation in SOI MOSFETs", Annual Research Summary Section 8, Jul. 1, 1994-Jun. 30, 1995, p. 1 of 1, available from http://dynamo.ecn.purdue.edu/ECE/Research/ARS/ARS95/Sec8/8_24.html.

Luryi, Serge et al., "Hot Electron Injection Devices", Nov. 27, 1984, Superlattices and Microstructures, vol. 1, No. 5, 1985, pp. 389-400, available from AT&T Bell Laboratories, Murray Hill, N.J. 07974 or Bell Communication Research, Murray Hill, N.J. 07974.

Gladkikh, A. et al., "Correlation Between Electromigration Damage Kinetics and Microstructure In Cu Interconnects", 1995, pp. -4, available from Department of Physical Electronics, Tel Aviv University, Ramat Aviv 69978, Israel, no month.

"Electromigration", pp. 1-4, available from http://en.wikipedia.org/wiki/Electromigration, no date.

Peter, Laura, "Early Failures are Key in Copper Electromigration", Semiconductor International, Jul. 1, 2002, p. 1 of 1, available from http://www.keepmedia.com/jsp/article_detail_print.jsp.

(Continued)

*Primary Examiner*—Don Le
(74) *Attorney, Agent, or Firm*—Walter D. Fields

(57) ABSTRACT

A programmable logic device may comprise a metric circuit operable to repeatedly perform a function and emit a first signal dependent upon its advancement into the function. A comparator may compare the first signal from the metric circuit to a predetermined reference signal. A controller may then selectively disable a portion of the programmable logic device dependent upon the results of the comparison. In a particular case, the weakened circuit may be a counter that repeatedly advances its count with a rate dependent upon an aging characteristic of a vulnerable element.

20 Claims, 10 Drawing Sheets

OTHER PUBLICATIONS

Sanches, Julian J., "Hot-Electron Resistant Device Processing and Design: A Review", 1989, pp. 1-8, available from IEEE, 3 Park Avenue, 17th Floor, New York, NY 10016-5997, no month.

"Choosing the Right Silicon Solution", EETimes, Sep. 27, 2004, pp. 1-3, available from Electronic Engineering Times, at http://www.eetimes.com.

Sullivan, Tim, "Electromigration", IBM Microelectronics, available from http://www.irps.org/irw/99/Tuts.htm, no date.

Chang, Chih-Wei (Jim), "Layout-Driven Hot-Carrier Degradation Minimization Using Logic Restructuring Techniques", 2001, pp. 1-6, available from Department of Electrical and Computer Engineering, University of California, Santa Barbara, CA 93106, no month.

Lloyd, J.R., "Electromigration for Designers: An Introduction for the Non-Specialist", IBM TJ Watson Research Center, Apr. 12, 2002, pp. 1-9, available at http://www.techonline.com/community/home/20421.

"Reliability in CMOS IC Design: Physical Failure Mechanisms and their Modeling", pp. 1-8, available from http://www.mosis.org/Faqs/tech_cmos_rel.pdf, no date.

* cited by examiner

PHYSICALLY-ENFORCED TIME-LIMITED CORES AND METHOD OF OPERATION

FIELD OF THE INVENTION

This disclosure relates to programmable logic devices, such as field programmable gate arrays (FPGA); and more specifically, it relates to physically-enforced time-limited cores in a programmable logic device.

BACKGROUND

As chip capacities have continued to increase, programmable logic devices have increased both in their complexity and number of programmable logic components. In particular, programmable logic devices may now comprise one or more intellectual property cores (IP cores), which may be variously described as pre-packaged blocks of logic or macros.

As the complexity of IP cores has increased, so has the required investment in labor and finances needed to create them. Given their increased complexity, expense and value, some IP cores may now be licensed for only a limited duration, after which duration, rights to the IP may expire. For example, a given license may allow use of an IP core for only a limited duration, which duration may be less than the actual physical lifetime capability of the device.

One example of a typically known method of enforcing a time-limited license may be associated with enabling timed access to a given prototype kit of IP cores. A prototype version of various IP cores, from a given library for example, may be shipped to a prospective customer together with or as part of an embedded development evaluation kit. A counter block may be buried within the design kit embedded within the programmable logic device and used to time a sample period duration by counting to a predetermined value. Upon the counter reaching the value, control resources of the prototype device may disable elements of the core, placing them in an unusable state. The disablement might be performed, e.g., by isolating input and/or outputs of the device or by constantly holding it in a reset state. Accordingly, the sampled IP core may remain operational for only a limited time (typically a few hours), after which time, a reset might then be required for beginning a new trial period.

SUMMARY OF INVENTION

In accordance with an embodiment of the present invention, a programmable logic device and a method of operation may configure programmable resources to enable enforcement of a time-limited license to a library module, such as an IP core. The licensed core may be selectively enabled for operability over a predetermined period of time, such as a given number of years.

In a particular case, aging effects of a vulnerable element may be quantified to provide a measure of time-lapse. This measure of time-lapse might then be used as the basis for enforcement of the time-limited license to the IP core.

In accordance with one embodiment of the present invention, a programmable logic device may comprise a weakened circuit operable to perform a function and emit a first signal dependent upon the age of the weakened circuit. A comparator may compare the first signal from the weakened circuit to a predetermined reference signal. A controller may then selectively disable at least a portion of the programmable logic device dependent upon the comparator's comparison.

In a particular case, the weakened circuit may comprise a counter that counts a sequence over a given duration, wherein the magnitude of the duration is dependent upon the age of the counter. The comparator may compare at least one of the count of the counter as obtained over a predefined duration relative to a reference count, and a duration as required by the counter to obtain a predefined count relative to a reference duration.

In accordance with another embodiment of the present invention, a method of operating a programmable logic device may comprise operating a weakened metric circuit with a degradation rate. A portion of the programmable logic device may be conditionally disabled dependent upon a degradation of the metric circuit.

In accordance with another embodiment of the present invention, a system may comprise an IP core selectively operable to perform a predefined function. A weakened metric circuit may be operable to produce a signal having a quantifiable trait that is dependent on aging of the metric circuit. A controller may then determine if the trait of the signal produced by the metric circuit exceeds a predetermined threshold and may control enablement of the IP core dependent on the determination.

In a particular example, the metric circuit may be formed using first design rules predetermined to enhance a dependency of the quantifiable trait to aging of the metric circuit, and other resources of the system may be formed using second design rules different from the first.

Embodiments of the present invention will be more fully understood in view of the following description and drawings.

DETAILED DESCRIPTION

Figure 1:
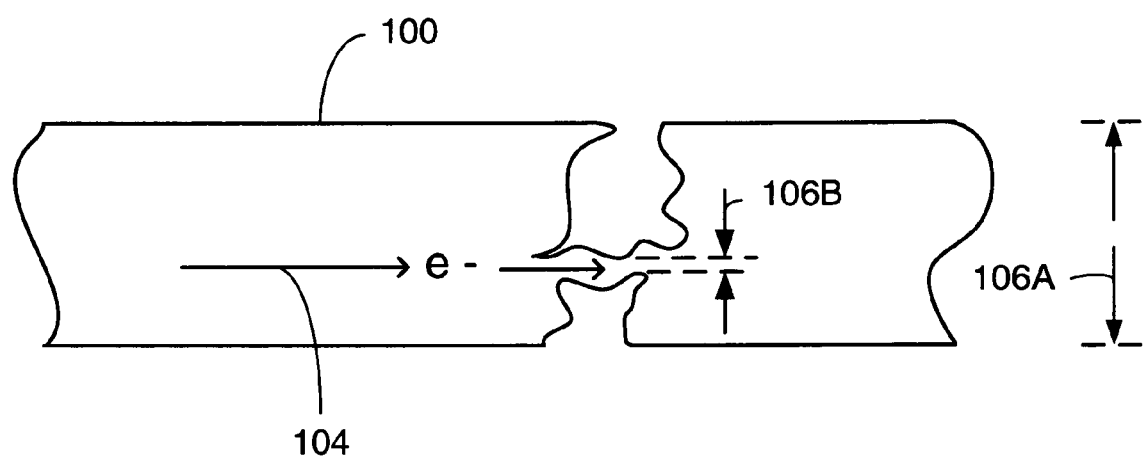
FIG. 1 is a planar view of a vulnerable element that may be used in accordance with an embodiment of the present invention.

In the following description, numerous specific details may be set forth to provide an understanding of exemplary embodiments of the present invention. It will be understood, however, that alternative embodiments may comprise sub-combinations of the disclosed examples.

Additionally, readily established circuits and procedures of exemplary embodiments may be disclosed in simplified form (e.g., simplified block diagram and/or simplified description) to avoid obscuring an understanding of the embodiments with excessive detail. Likewise, to aid a clear and precise disclosure, description of known processes or devices may similarly be simplified where persons of ordinary skill in this art can readily understand their structure and operations by way of the present drawings and disclosure.

As used herein and depending on context, a core or IP core may be understood to be representative of a group of programmable resources that may be configured per a given library net list, hardware description language (HDL) sequence, or other known techniques for describing hardware or circuits. Such IP cores may be available to perform a wide variety of tasks and may serve many purposes. For example, some IP cores may define a multiplexer, an adder, a multiplier, an accumulator, a block RAM, a bus interface, shift registers, encryptors/decryptors, a FIR filter, content-addressable memory, an SDRAM controller, an arbitrator and bus structure, a processor (e.g., Xilinx Microblaze), or numerous other possible logic components of a PLD.

Typically, the electrical properties of a silicon die may degrade with use and over time. Design rules issued by a fabrication facility (e.g., foundry) may generally be followed by a chip designer to provide for a chip of operability over a desired "industry-accepted" period of time. If a designer does not follow such rules, then, dependent upon a variety of factors, the chip may be prone to more rapid aging or degradation with respect to time. In particular examples, failure mechanisms may be manifested by lower operative current, higher resistance, excess heat, slower performance, errors (e.g., timing or logical errors), cessation of function, or other effects. Accordingly, it may be recognized that circuits fabricated according to particular design rules may perform for a number of years in a variety of environments and with a reliability that may be dependent upon the foundry design rules. The same may be true regarding IP cores that may define part or all of one or more chips.

In particular embodiments of the present invention, cores, circuits or chips may be fabricated for enhanced degradation rates (a reduced lifetime) relative to the lifetime of the other customary cores, circuits, or chips. Such circuits for enhanced degradation rate may be variously described as "age-limited", "weakened", "time-limited", or the like.

In particular embodiments, the time-limited or weakened circuits may be designed and fabricated using weakened or relaxed design rules that may render the circuit more vulnerable to stress and physical aging. For example, customary design rules typically aim to guard against electromigration degradation. By replacing the design rules with relaxed alternative design rules, components of reduced robustness and/or enhanced vulnerability or sensitivity to electromigration may be realized. In another example, the design rules that are related to hot carrier effects may be relaxed or replaced with design rules providing for reduced robustness relative to hot carrier effects.

The development of such relaxed or replacement design rules, in some cases, may be facilitated by use of computer-aided modeling and/or silicon die testing. Further, aging characteristics to a die sample (e.g., chip, core, or portion thereof) may be tested or calibrated for predicting the degradation rate for the weakened circuits over a given period of time (e.g., years). Particular time-limited, weakened devices might thus be realized for various expected lifetimes and/or degradation rates by way of the developed, modeled and/or tested design rules and circuits.

In forming the weakened circuits, an element may be formed for enhanced stress and accelerated aging. Such elements may comprise, for example, at least one of a transistor (MOSFET), trace, dielectric, capacitor, resistor or the like formed or configured by design rules predetermined to enhance its stress vulnerability and/or degradation rate during operation within the weakened circuit.

For example, referencing FIG. 1, trace 100 may be designed to be more vulnerable to electromigration relative to other interconnects of the integrated circuit. Trace 100, as a vulnerable element, may have a width 106A that may be narrowed to a width 106B along a length thereof. When exposed to a sufficient current 104, a current density within the narrowed width 106B may affect electromigration of metal (e.g., aluminum, copper, etc.) within a particular location of the wire 100. This, in turn, may further thin the width 106B of the trace. The thinned portion 106B may thereby present a greater resistance relative to that of its earlier state. In another embodiment, trace 100 may be operated in an environment that promotes aging. For example, trace 100 may be subjected to high current or constant current or high voltage.

Accordingly, the electromigration may be understood to result in increased resistance of trace 100. If trace 100 is part of a logic device, the increased resistance may influence the performance of the device. For example, the increased resistance may incrementally affect the timing of given logic circuits, until such time that increased delay may result in errors.

In another example, the electromigration may cause a break or separation in trace 100, resulting in an open circuit.

In some embodiments, a counter may serve as the weakened circuit that may incorporate trace 100 as a vulnerable element therein. Over time, the increased resistance may result in slower counter performance, wherein the counter may count more slowly as the trace degrades.

Figure 2:
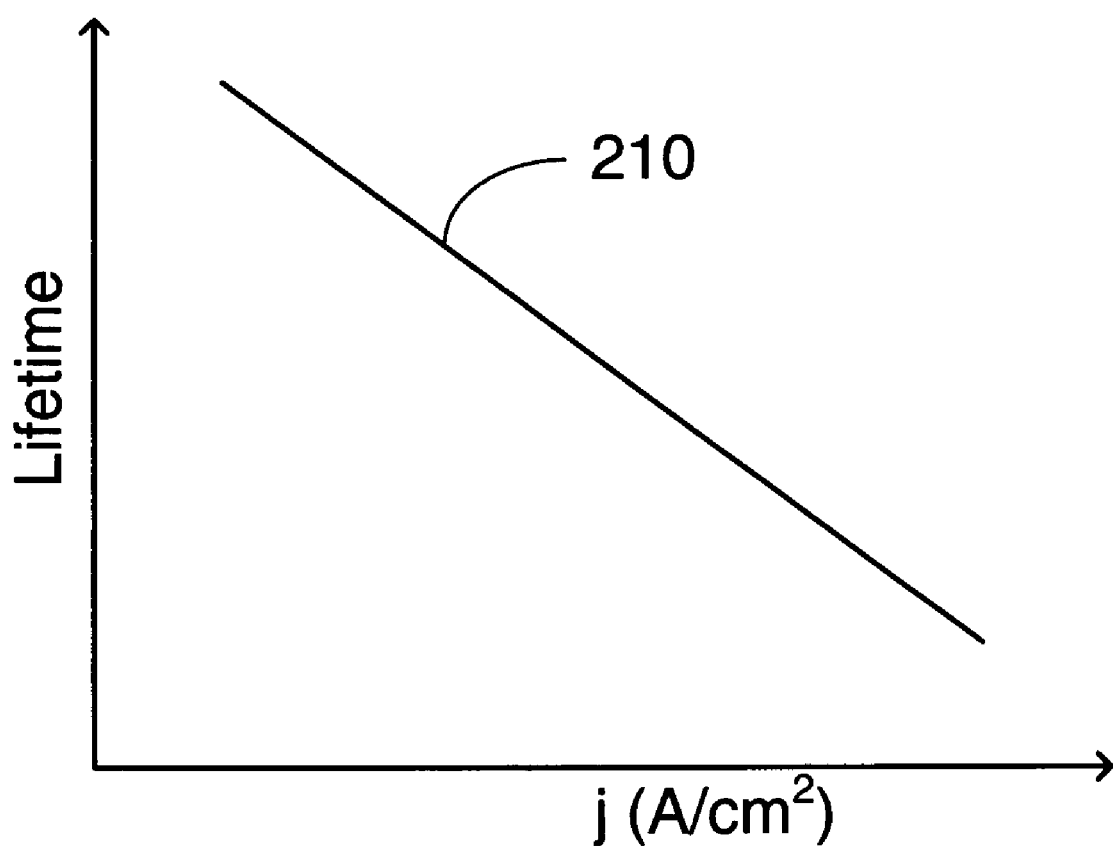
FIG. 2 is a hypothetical graph showing a relationship between current density and prospective lifetime to a vulnerable element for embodiments of the present invention.

It may be theorized that various factors may affect the degree to which a trace may be impacted by electromigration. Referencing chart 200 of FIG. 2, in particular examples, a proportional relationship 210 may be modeled between applied current density j (amperes/cm$^2$) and electromigration degradation. That is, higher current densities may result in greater electromigration and more rapid degradation. Further, it may be understood that the electromigration may also increase in proportion to increased temperature and might also be affected by the type of metallization. For example, some metals (e.g., aluminum) may be less resistant to electromigration and degradation than other metals (e.g., copper). Additionally, the relationship of the degradation over time may be linear or may be exponential, or follow some other pattern, depending on the physical effect.

In further embodiments, silicon/metal junctions may serve as the vulnerable element susceptible to degradation, e.g., by electromigration. It may be theorized that as electrons flow from silicon into the metal, electromigration may cause metal to migrate or thin away from the silicon. Accordingly, over time, the electromigration may reduce the amount of metal and cause a higher resistance, or even an open circuit. It may be further theorized that the migrating metal may accumulate at the junction. Various strategies known in the art typically provide for design rules to reduce the potential effects of such electromigration. For example, diffusion barriers may be disposed between the metal and silicon. In contrast, however, and consistent with particular embodiments of the present invention, weakened or replacement design rules may be employed that may omit one or more such strategies of the typical foundry rules. Accordingly, the elements to be fabricated may be more prone to degradation.

Figure 3:
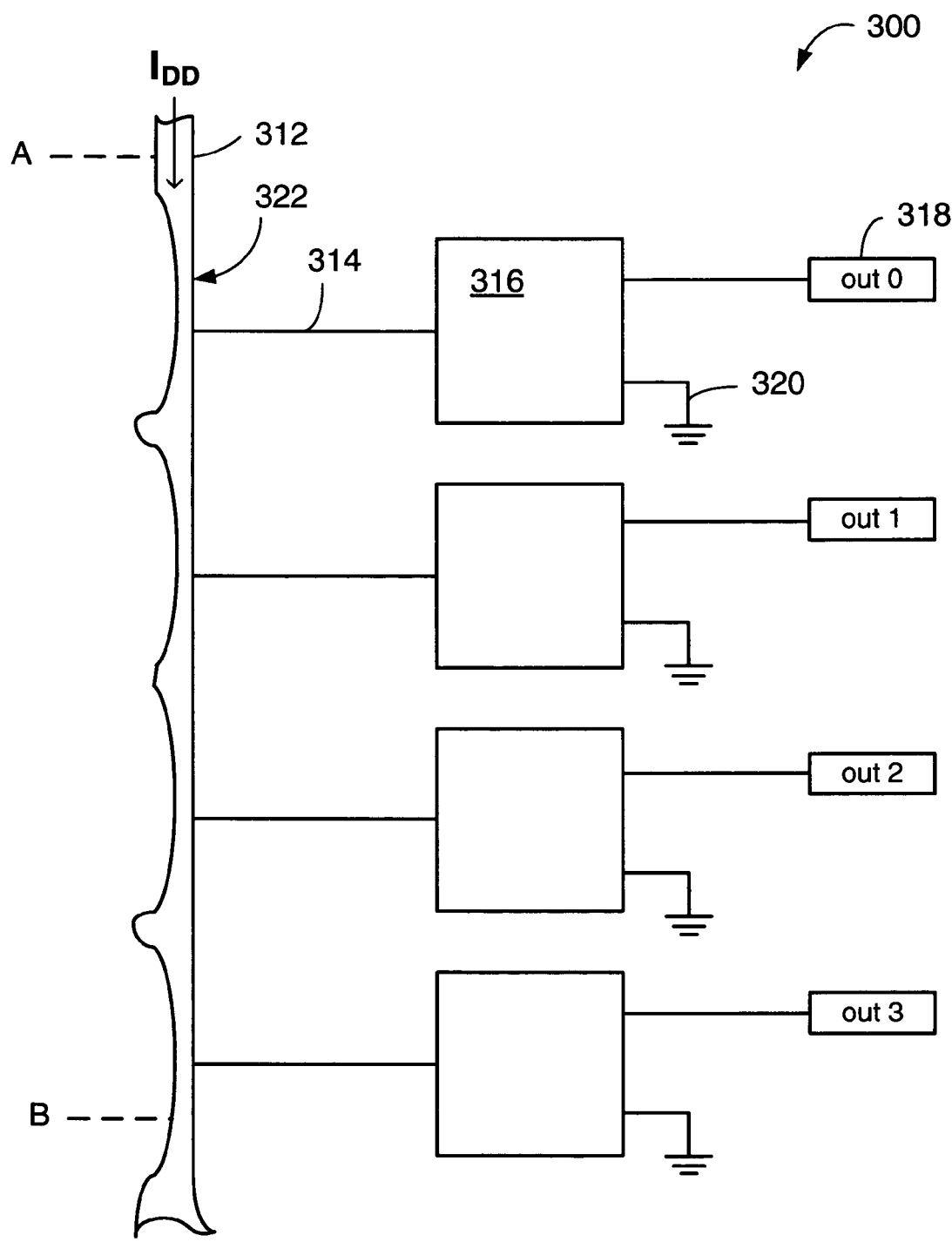
FIG. 3 is a simplified block diagram showing a weakened circuit employing one type of weakened or vulnerable element for controlling timed enablement of an IP core in accordance with an embodiment of the present invention.

Referencing FIG. 3, a portion of a metric circuit 300 (e.g., a counter) may be formed using an element 312 of weakened design rules for increased vulnerability or susceptibility to degradation. In a particular embodiment, weakened circuit 300 comprising vulnerable element 312 (e.g., such as a connection or trace), may be exposed to operative current/voltage bias levels that may stress the element.

In a particular example, vulnerable element 312 may be subject to an applied current density in excess of typical current levels. Being stressed by this greater current density, the element may be subject to electromigration (e.g., narrowing) for accelerated degradation relative to what might otherwise result with lower operative current density. Since aging is caused by the stress in the environment, vulnerable element 312 may be identical to non-vulnerable elements, but is rendered vulnerable by the additional stress caused by increased current, voltage or temperature.

In one embodiment, a trace may be formed with thinned sections 322 (e.g., of reduced width) predetermined to emulate a given degradation rate. As the element ages, the increased resistance may cause slower performance and/or delayed outputs when associated with given logic circuits. For example, if the vulnerable element is used to define part of a counter, it may cause the counter to count more slowly. The slower counting may then be detected, e.g., by periodic comparison of a comparator.

In another embodiment, a voltage drop between a first point (e.g., Point A) and a second point (e.g., Point B) may increase. Stated otherwise, an electrical signal passing through the degraded trace may comprise a voltage at the second point that may be lower than what it had been prior to the effects of electromigration. The gradual change in voltage, lowering of the voltage, may be detectable by, e.g., a comparator or by observing the performance degradation of a standard circuit (e.g. a counter) that uses the resulting voltage as its power supply.

In further embodiments, a weakened circuit may comprise an element vulnerable to hot carrier injection degradation. For example, a MOSFET may experience reduced transconductance ($g_m$) depending upon the level of hot carrier degradation. Its reduced transconductance, may, in particular examples, result in increased resistance.

In general, transconductance ($g_m$) of a MOSFET may be inversely proportional to resistance (R), e.g., $g_m \propto 1/R$. In particular contexts, the transconductance may be expressed as the change in the drain/source current of the MOSFET over the change in its gate-to-source voltage ($V_{GS}$). Stated otherwise, a change in the transconductance may reduce the coupling between gate voltage and drain/source current ($I_{DS}$):

$$\Delta V_{GS}(g_m) = \Delta I_{DS}$$

Accordingly, with declining transconductance, a given change in the gate-to-source voltage may result in ever-declining drain/source current. Thus, a metric circuit may be intentionally designed for increased vulnerability to such hot carrier effects so as to increase its sensitivity to aging degradation. For example, the increased resistance, reduced transconductance, slower performance, errors, or other age-related physical affects may be used to indicate the degradation as a metric for age. To expose the aging or increase hot-electron trapping, the transistor or circuit may be operated at, for example, an elevated voltage, a constant current or a high current.

In other embodiments, a weakened circuit may provide a constant logic level and include a weakened element that causes the circuit to provide a different logic level after a certain period of time. For instance, a weakened circuit may include a vulnerable element coupled to a voltage source for providing a logic 1. Aging effects may cause the vulnerable element to fail after a period of time such that the circuit now provides a logic 0. This change in logic level may be detected, for example by a comparator. In some embodiments, multiple such weakened circuits may be used to provide a range of time periods.

For example, in FIG. 3, a plurality of weakened circuits 316 may include a plurality of vulnerable elements (e.g., each of the thinned segments 322 of connection 312). The outputs 318 (e.g., out0–out3) of weakened circuits 316 may initially provide logic 1's. When a thinned segment 322 fails, the corresponding circuit 316 may provide a logic 0, thereby indicating a certain time period has elapsed. In some embodiments, segments 322 may be pre-designed or "pre-aged" to age at different rates. For example, each segment may be thinned to varying degrees. When such segments are exposed to similar operating conditions, they will fail at varying times. The time to failure may be calibrated, as described in greater detail below, and each segment may provide an additional interval (e.g., one month, six months, one year). Thus, the vulnerable elements may fail in an order based on their level of pre-aging and at regular intervals, and a particular time period may be measured by the number of vulnerable elements that have failed. Outputs 318 may be compared with a reference signal having a pattern of 1's and 0's corresponding to a desired period of time. When outputs 318 match the reference signal, the desired time period has elapsed.

Figure 4:
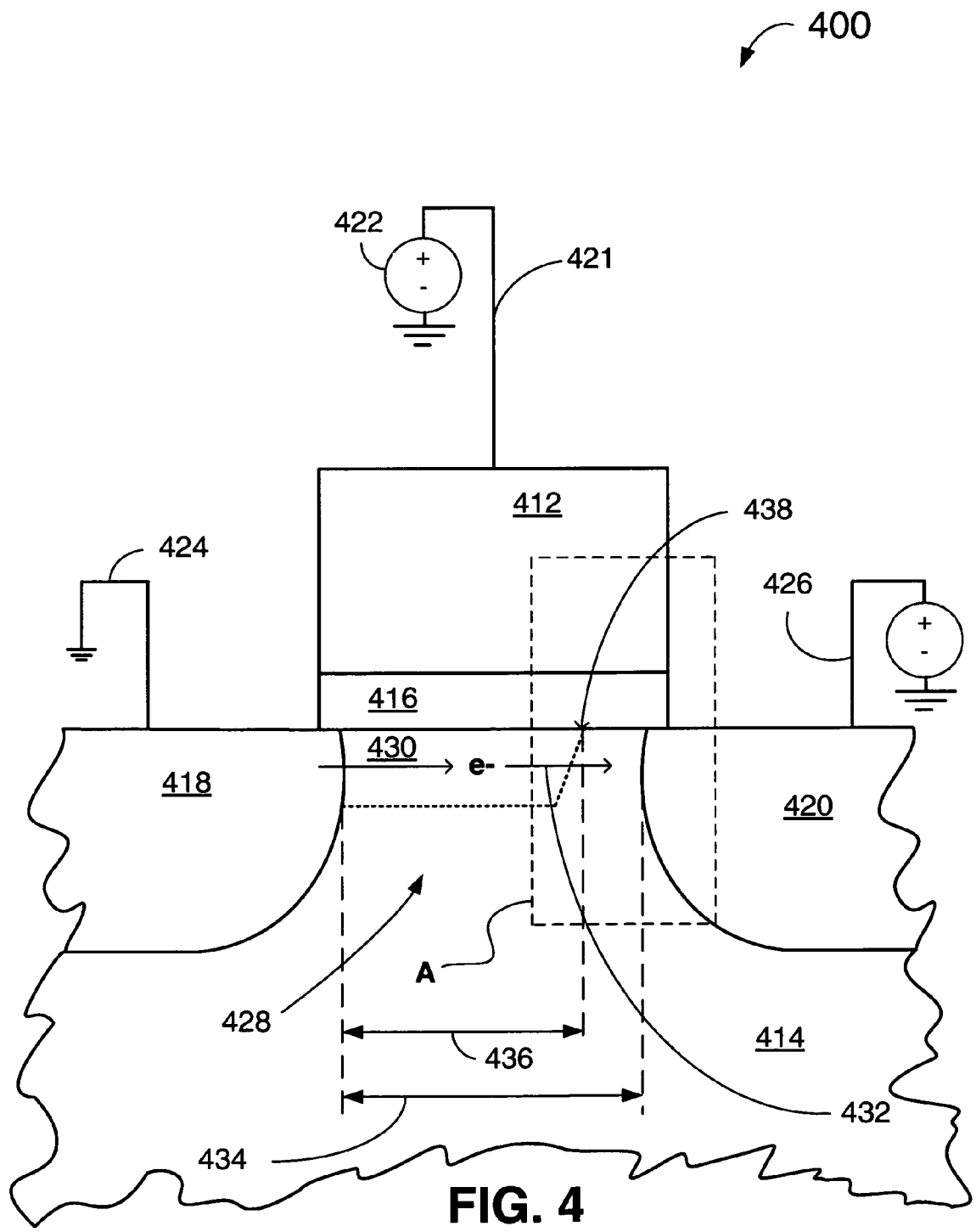
FIG. 4 is a simplified cross-sectional view of a MOSFET device that may be used as a vulnerable element within a metric circuit for controlling enforcement of a time-limited license to an IP core in accordance with further embodiments of the present invention.

Referencing FIG. 4, an n-channel metal-oxide-semiconductor field-effect-transistor (NMOSFET) 400 may be formed, consistent with an embodiment of the present invention, with weakened design rules for increased susceptibility to hot electron degradation or operated at elevated current or voltage. Gate 412 may be capacitively coupled via dielectric layer 416 to a p-type substrate 414, which may comprise an NMOSFET body region 428 of body length 434. A bias stress circuit may be operable to establish a drain-to-source voltage ($V_{DS}$) for stressing the MOSFET, e.g., wherein hot electron effects may result.

Figure 5:
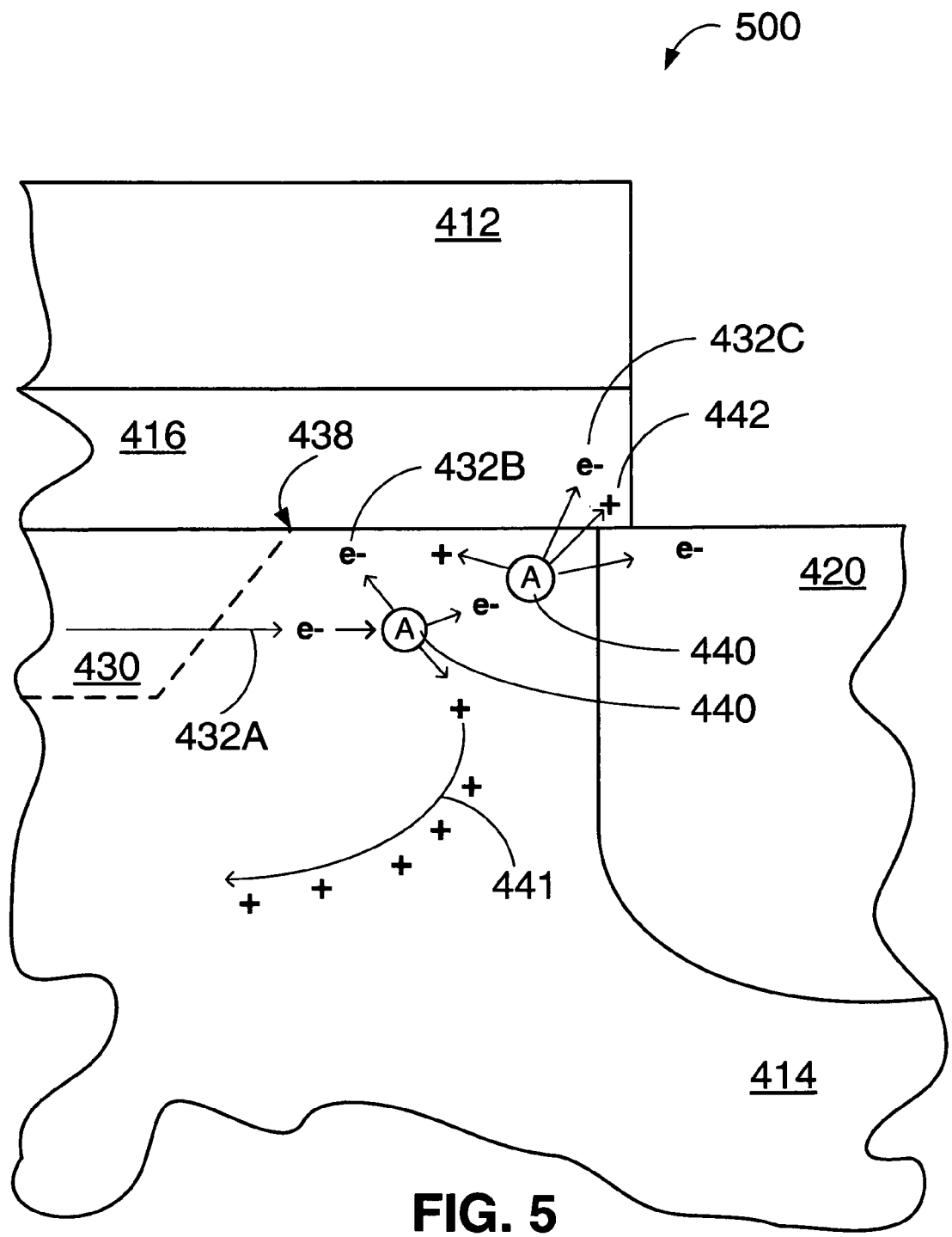
FIG. 5 is a simplified cross-sectional view providing an exploded representation to a portion of the MOSFET of FIG. 4, illustrating a proposed theory of operation for assisting a better understanding of certain embodiments of the present invention.

Referencing FIGS. 4–5, as the vulnerable element to a metric circuit, consistent with one embodiment, n-channel metal-oxide-semiconductor field-effect-transistor (NMOSFET) 500 may be formed specifically for susceptibility to hot electron degradation. With appropriate voltage/current bias applied to the MOSFET, the channel may reach a pinch-off state—with the drain-to-source voltage ($V_{DS}$) beyond a saturation voltage ($V_{DSAT}$)—wherein some of the electrons that accelerate towards the drain region 420 may collide with the substrate atoms 440 with sufficient impact energy so as to ionize other atoms for creating electron/hole pairs—carriers. These carriers, in turn, may be further accelerated by the electric fields within the pinched-off channel region beneath the gate. Some of the holes generated may drift into the substrate under the influence of the electric field, which may establish a hole current 441.

Other carriers (e.g., electrons 432B and holes 442) may be directed through upper surface regions of substrate 414 and toward dielectric 416. If accelerated with sufficient energy, some of these carriers may tunnel into/through the dielectric and become trapped in the dielectric 416 or at the boundary between the dielectric 416 and the substrate 414.

These trapped carriers may establish a fixed charge which, over time, may accumulate to further degrade the performance of the NMOSFET.

Such degradations may be understood to increase its operative resistance, decrease its transconductance, and/or decrease its carrier mobility in the channel. The degraded performance may be measurable via the reduced drain/source current, higher resistance and/or slower performance.

In particular embodiments, the NMOSFET may be designed and/or fabricated for biasing with higher voltages (e.g., $V_{GS}$, $V_{DS}$ etc.), which may accelerate hot electron degradation. For example, the dielectric thickness may be reduced relative to the thickness otherwise established by the customary design rules. In further embodiments, other means may be used to accelerate the hot electron degradation (e.g., low operating temperature, clock rate, etc.).

Replacement design rules by which to fabricate a vulnerable MOSFET may be developed by testing and/or simulation in order to establish desired rates of degradation with particular voltages, dielectric thicknesses and/or other device characteristics. Thus, weakened or vulnerable element devices may then be built to degrade at a desirable rate so as to lend time resolution for determination of a particular license term.

In other embodiments, a PMOSFET may be used in place of the NMOSFET. That is, a PMOSFET may be designed and/or fabricated for accelerated hot electron-related degradation. The hot electron effects may be associated with greater PMOSFET switching speed, lower resistance, and/or faster operation. That is, as the PMOSFET degrades per the hot electron effects, its rate of operation may increase dependent upon hot electron effects. The metric characteristic may thus be alternatively represented by an increasing rate of operation with respect to time and/or short-circuit failure effect.

Figure 6:
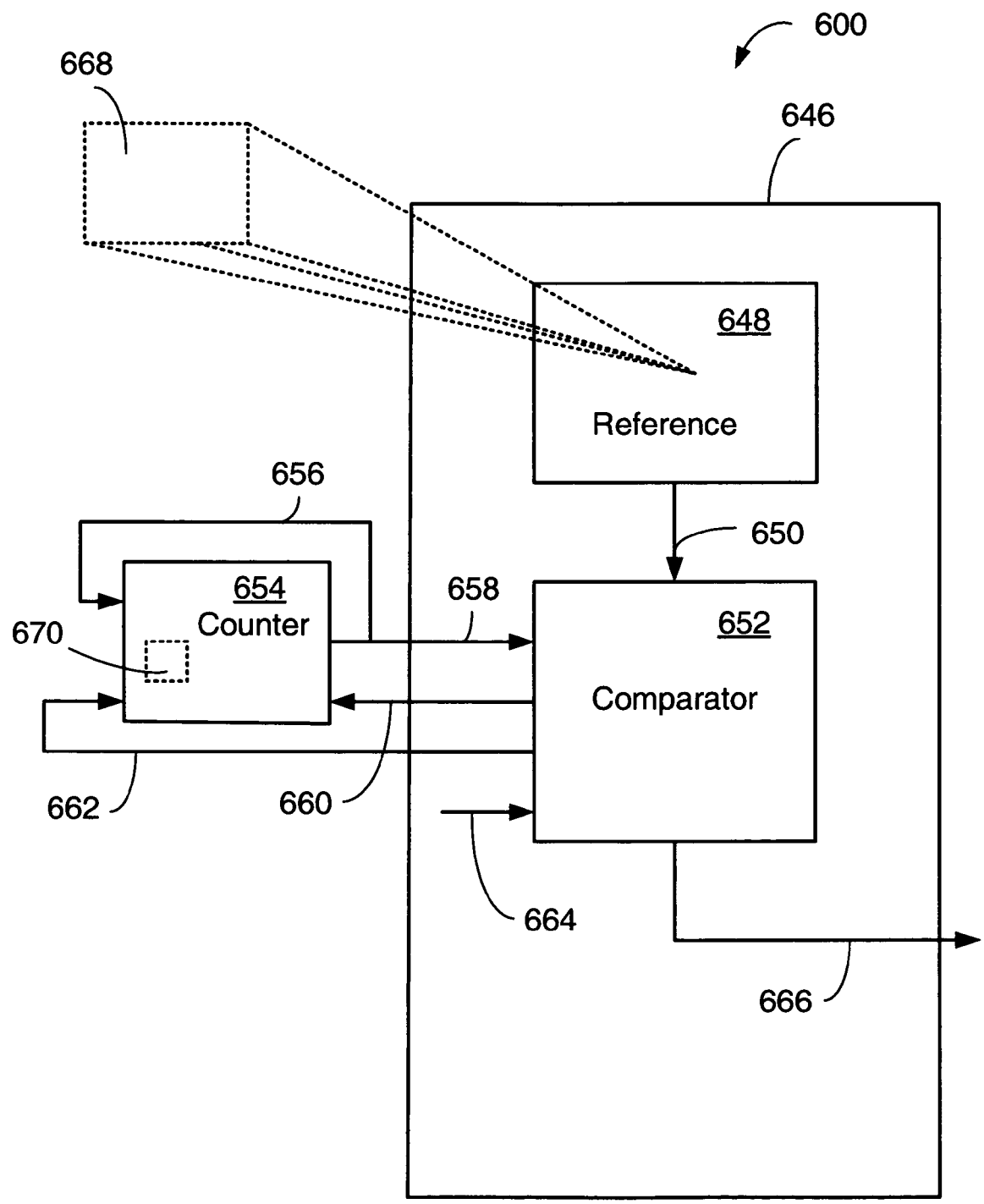
FIG. 6 is a simplified block diagram of a system operable for enforcing a time-limited license in accordance with an embodiment of the present invention.

Referencing FIG. 6, programmable logic device 600 may comprise an age-limited (e.g., weakened, physically-time-limited, etc.) circuit 654 and second circuitry 646. In one embodiment, the components may be formed in separate physical blocks. In alternative embodiments, they may share some portion of circuitry and/or logic within a similar physical space.

In certain embodiments, metric circuit 654 may be age-limited dependent on various factors. For example, it may comprise elements and/or devices (e.g., as described with reference to FIGS. 1–5) designed, implemented and/or fabricated to be more vulnerable to aging or age degradation, which may be characterized by, e.g., electromigration (e.g., 100 of FIG. 1; 300 of FIG. 3), hot electron injection, time-dependent dielectric breakdown, interconnect corrosion, short-circuit, open-circuit, logic error, failure and/or a combination thereof.

In one example, an age limitation to an element 670 of a first circuit 654—i.e., a metric circuit—may be dependent upon a hot electron injection aging characteristic. The hot electron effects may be understood to impact the circuit's rate of operation with respect to time. For example, a change in propagation delay of a vulnerable MOSFET may influence the circuit's rate of operation. It will be understood that the change might also be characterized by another parameter, such as electrical characteristics of changing current, changing voltage, changing resistance, etc.

Further referencing FIG. 6, the other or second circuitry 646 may comprise logic 648 for storing data 668, such as a reference value or set of reference values. The reference data 668 may define, e.g., a trigger value or set of threshold values that may be stored in a register or set of registers such as static random access memory (SRAM) or other memory of the programmable logic device.

Figure 7:
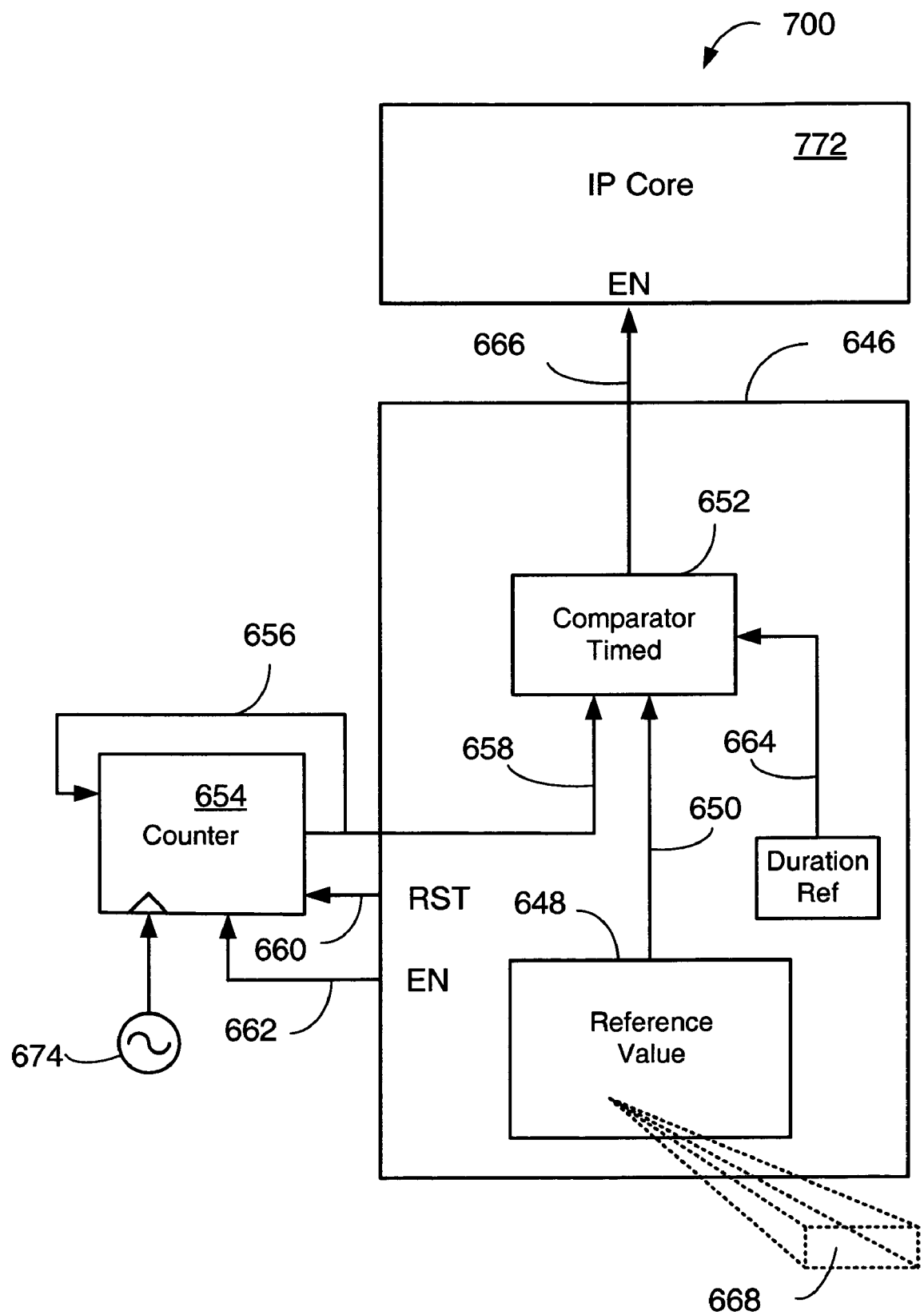
FIG. 7 is a simplified block diagram showing a system for enforcing a time-limited license to an IP core of, for example, a programmable logic device, in accordance with an embodiment of the present invention.

In accordance with a further embodiment, referencing FIG. 7, the weakened circuitry 654 and other circuitry 646 of the programmable logic device may be used as a controller for selectively enabling an IP core 772 within system 700. A first oscillator 674 may have the vulnerable element, such as a MOSFET, resistor, capacitor, dielectric, and the like, vulnerable to increased propagation delay with age. The weakened circuit 654, such as a counter, driven by the first oscillator 674 may be configured to incrementally count a predetermined sequence. Comparator 652 may examine the count of counter 654 when enabled 664 by a controller. A second oscillator, independent of the first oscillator, may provide timed enablement for operation of comparator 652. Thus, the second oscillator may establish the reference duration by which to trigger the periodic comparisons. A count 658 from counter 654 of the weakened circuit may then be compared by the comparator against reference value 650, as may be presented thereto by register 648. Depending upon the results of the comparison, comparator 652 may then selectively enable IP core 772.

With each comparison, the controller may further reset counter or weakened circuit 654 and again enable 662 it for performing another count.

In another embodiment, a reference circuit may provide a reference signal. Such a circuit may be constructed identically with the original age-limited circuit, but without the weakened element or not operated in the environment that weakens the element. Therefore, both the age-limited circuit and the reference circuit start identically, and the age can be determined by the difference of the age-limited circuit from the reference circuit. By having both an age-limited circuit and a reference circuit that is identical except for the weakened elements, the enablement check can be made independent of voltage and temperature variations.

Figure 8:
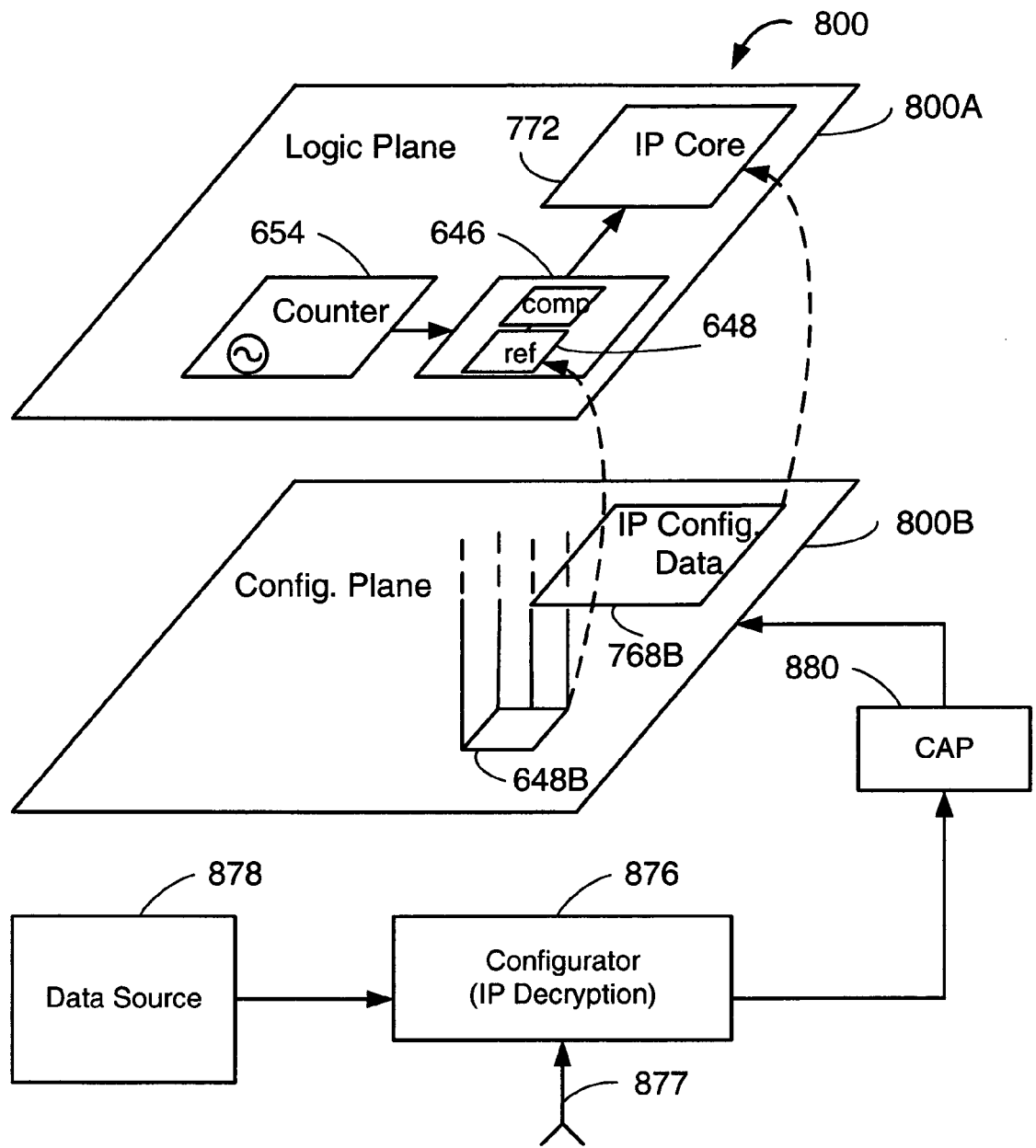
FIG. 8 is a simplified logical block diagram of a programmable logic device, in accordance with an embodiment of the present invention, showing a controller to enforce a time-limited license to an IP core and provisions for recovering configuration data for the IP core and reference data for the license duration associated with the IP core.

Moving forward with reference to FIG. 8, programmable logic device 800 may use configuration data 768B on the configuration memory plane 800B for configuring IP core 772 within logic plane 800A. Additionally, reference data 648B may also be programmed in the configuration memory plane for use by the comparator of controller 646 as a basis for selective enablement of the IP core. It may be understood, therefore, that such reference data may be stored in registers 648B which may also be accessible from the configuration memory plane 800B. Accordingly, updating and/or reconfiguring the reference data 648 might be as simple as writing the configuration memory plane of the programmable logic device. Note that logic and configuration memory planes are merely conceptual, and are used herein for descriptive purposes only. In actual physical implementations, logic and configuration memory portions may share one or more planes.

In a particular embodiment, further referencing FIG. 8, the reference data 648B may be stored in a dedicated region of the configuration memory plane 800B of the programmable logic device 800. Further, a configurator 876, responsive to at least one of a device boot-up, reset, or reconfiguration request 877, may receive configuration data from a source 878, such as the boot-up memory internal to the programmable logic device or a data source external to the programmable logic device. Receiving the configuration data, the configurator may determine the presence of data associated with a licensed IP core 772. For example, configurator 876 may recognize a configuration listing for an IP core of a given library or prototype kit. Upon recognizing the data for the licensed IP core, the configurator may enable a configuration access port 880 for accessing the configuration memory plane 800B. It may then transfer the configuration data into locations 768B associated with the IP core.

Additionally, configurator 876 may parse or determine a license duration accompanying the data of the IP core instructions. Upon obtaining the license duration associated with the licensed IP core, the configurator may determine an appropriate reference value for storage in registers 648 of time-limiting controller 646.

In a particular case, predetermined or calibrated data regarding the rate of degradation of counter 654 may be used by the configurator in combination with the parsed license duration for deriving an appropriate reference value for storage in registers 648.

In one embodiment, the registers for the reference value may be of the logic plane and also be accessible from the configuration memory plane. In an alternative embodiment, the determined reference values may need to be sent to a dedicated register of the logic plane independent of the configuration memory plane 800B. Accordingly, a configuration access port might then be configured alternatively for enabling programming of the dedicated register within the logic plane.

In another particular embodiment, the reference register 648 may comprise flash memory or other nonvolatile memory (e.g., programmable read-only memory (ROM)). During fabrication, these registers may be formed with predetermined reference values by which to assist time-limited control of the licensed IP cores 772.

Moving back with reference to FIG. 7, in yet another embodiment of the present invention, the reference duration 664 might also be programmed based on the amount of time that might typically be expected for the counter of weakened circuit 654 to obtain a predefined counter value. In this particular embodiment, comparator 652 may be enabled following a predefined reference duration 664 for checking the count of counter 654 relative to the reference value 650.

Alternatively, the count from counter 654 might be used as the basis for triggering a determination of time lapse. Although not shown specifically, a timer of controller 646 may be configured to determine the amount of time lapse required for counter 654 to obtain a predetermined reference value. A comparator might then query the time lapse of the free-running timer for comparison to a predefined reference duration, which might then be used as the basis for enabling IP core 772.

Returning to FIG. 8, again, it may be understood that data for establishing the predefined count for triggering the duration check may be obtained from configuration data source 878 and programmed into the select registers of the programmable logic device by way of configurator 876. For example, configurator 876 may determine an appropriate reference duration based upon an IP license duration accompanying the IP core and/or in combination with a predefined or calibrated rate of degeneration for the weakened circuit 654.

In further embodiments, further referencing FIG. 8, the configuration data source 878 may store the data for configuring the licensed IP core and information regarding its licensed duration in an encrypted state. With the IP core data encrypted, the system may be effective in preventing or making it difficult for customers to change a value or set of values associated with the time-limited license duration 668. For example, in a licensor/licensee context, a licensor may designate the duration data 668 to comprise a value or set of values that may be encrypted in accompaniment with the IP core configuration data. A cryptographic key may then be known only to the licensor, but not to the licensee. This may hinder or prevent the licensee from changing the values (i.e., license duration) associated with the encrypted data 668. For example, the licensee may not then be able to easily overwrite the data 668 or use partial reconfiguration of the programmable logic device to broaden a range of values to be associated with enablement of the licensed IP core.

In other embodiments, the IP core may be constructed of fixed logic, with a programmable or non-programmable time-license duration that can be set at manufacturing time or by writing a configuration register. In other embodiments, the IP core may be constructed of instructions for a microprocessor.

In other embodiments, the configuration data and that associated with the license duration may be protected simply by password or other security mechanism.

Further referencing FIGS. 6–8, metric circuit 654 may be operable to repeatedly perform a function that may consume a substantial duration (e.g., ten seconds, one second, etc.). For example, metric circuit 654 may comprise a counter for counting from zero to, for example, $2^n$.

In other alternative embodiments, metric circuit 654 may define arithmetic logic for computing the factorial of a number:

$$f(n)=n*f(n-1)$$

The value of n may depend on design considerations (e.g., desired runtime of function, clock speed, etc.). It may be understood that many other time consuming functions are also possible.

Further referencing FIGS. 6–8, in particular embodiments, comparator 652 may be enabled at regular time intervals, which may be driven by a periodic clock pulsed at clock input 664. It may be understood that the source for this periodic clock may be asynchronous and/or independent of clocks for clocking 674, e.g., the counter of metric circuit 654.

Further referencing FIGS. 6–7, metric circuit 654 may comprise vulnerable element 670 in clocking means 674 for influencing the clocking or rate of operation of at least a portion of metric circuit 654. For example, if metric circuit 654 comprises a counter, an action associating with counting (e.g., incrementing a number, generating a carry, storing sum as input to next increment, etc.) may be performed at each clock pulse provided by the oscillator 674, which may have an oscillation frequency defined in part by the vulnerable element.

For example, oscillator 674 may comprise NMOSFET (e.g., 400, FIG. 4; 500, FIG. 5) with age-limited properties associated with hot electron injection. Or, in another example, it may comprise an interconnect, trace or wire (e.g., 100, FIG. 1; 312, FIG. 3) that may have age-limited characteristics associated with electromigration. As the vulnerable element degrades, its change in physical properties may influence the frequency of the oscillator; and, in turn, it may influence the counting rate of the counter. For example, the counting rate of the counter may decline dependent upon the age-limited characteristics of the oscillator or other clocking means.

In some embodiments, further referencing FIGS. 6–8, comparator logic 652 may receive both output 658 from metric circuit 654 and output 650 from data storage logic 648 and may determine, for example, if the counter value 658 is within a range of values associated with output 650. In further embodiments, the comparator may check only a portion of bits (e.g., the high order bits) as representing the respective values. In other embodiments, data storage logic may comprise a reference counter or circuit constructed identically to counter 654 except without the age-limited property or not operated in an environment that subjects it to aging. Comparison may include enabling the IP core if the age-limited counter produces a result near enough to the reference counter.

In some embodiments, comparator logic 652 may drive output 666 for sending data, e.g., such as a signal or a value, dependent upon its determinations.

In a further embodiment, the comparator may determine whether a number received from the output 658 of the metric circuit is within a given range of numbers. If the sampled number is outside the reference range, comparator logic 652 may emit a signal via output 666 to a controller for disabling and/or rendering unusable IP core 772.

The embodiments discussed above relative to changes in an operative rate of metric circuit 654 may be varied in numerous ways. In an alternative embodiment, metric circuit 654 may be repeatedly operable to perform the function and send a signal (e.g., final number n counted to, final computation of n!, random number, etc.) upon completing the function. Upon receiving the signal, a comparator may determine the time that has elapsed since a previous receipt of such signal from the metric circuit 654. If the elapsed time should be outside a predefined range, comparison logic may drive a controller to disable and/or render unusable an IP core.

In another particular embodiment, an elapsed time higher than the predefined range may be associated with a declining operating rate associated with metric circuit 654. Alternatively, an elapsed time lower than the predefined range may be associated with an increasing operating rate associated with metric circuit 654. As discussed above, decreasing and/or increasing operation rates associated with metric circuit 654 may be dependent upon age-limited characteristics of a vulnerable element 670.

In some embodiments, metric circuit 654 may output a signal (e.g., a number, a random signal sent at fixed time intervals, etc.) via output 658 to comparator logic 652. Comparator 652 may associate the value with a quantifiable physical characteristic of the signal (e.g., current, voltage, etc.), to be compared to a range of values. A value outside the range may be indicative the age-limited characteristics of the metric circuit 654. For example, it may represent a decrease in current and/or voltage predetermined to relate to an increase in physical resistance for a vulnerable element 670 of metric circuit 654—e.g., as may be caused by electromigration and/or hot electron injection degradation.

In typical embodiments, once a license has expired, further referencing FIG. 8, operability of the licensed IP core 772 may be disabled by the time-limited controller 646 dependent upon a quantifiable characteristic of the signal produced by metric circuit 664 (e.g., disable if current of the signal is below a given amperage range). That is, once the license has expired, operability of the IP core is lost.

Figure 9A:
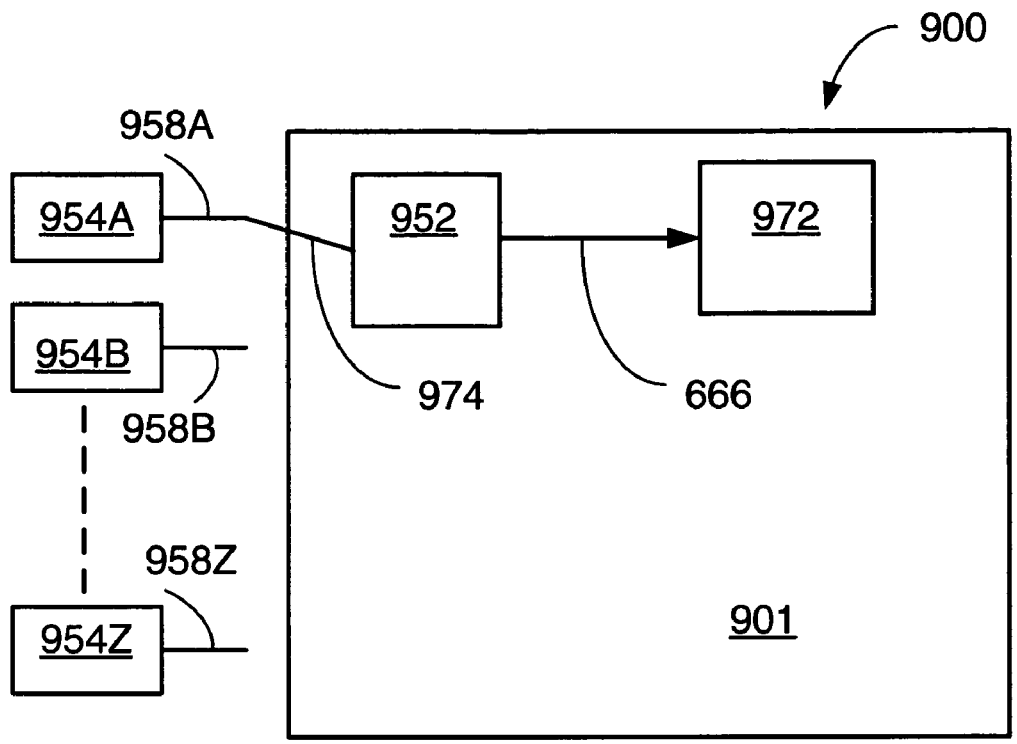
FIGS. 9A and 9B are simplified block diagrams illustrating systems for enforcing time-limited licenses to an IP core, in accordance with a further embodiment of the present invention, and showing a plurality of metric circuits that may be selected to assist determinations of time lapse.
Figure 9B:
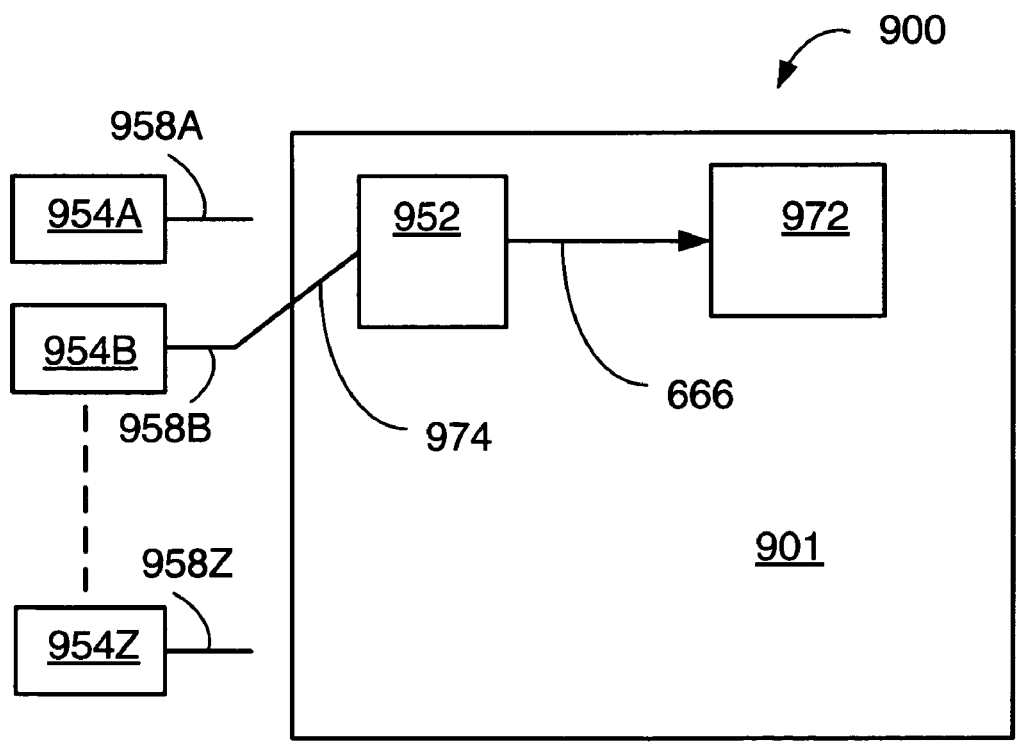

Referencing FIGS. 9A and 9B, in accordance with a further embodiment of the present invention, a programmable logic device 900 may comprise licensed IP core 972 to be operable with a limited initial duration as set forth by the IP license. For this embodiment, in comparison to embodiments described previously with reference to FIG. 6, the programmable logic device may comprise a plurality of metric circuits 954B, 954B . . . 954C. During configuration, the programmable logic device may be configured to select from one of the plurality of metric circuits by which to determine the given time-limited expiry for the licensed IP core. A select metric circuit, for example, first metric circuit 954A of FIG. 9A, may be configured to drive the comparator logic 952. Once comparator logic 952 determines the degradation of first metric circuit 954A to have reached a given threshold level, it may then drive output 666 for disabling further operation of the licensed IP core 972. At this point, metric circuit 954A may have aged to the point of no longer being available for further age quantification or metering.

Accordingly, a configurator of programmable logic device 900 might then reconfigure a selection from the plurality of metric circuits by which to drive comparator 952. For example, the reconfiguration may select a different or second metric circuit 954B, as illustrated by FIG. 9B, operable with a degradation rate newly and independently operable of first metric circuit 954A. Accordingly, IP core 972 might then be further operable (as enabled by controller 952) for metering a duration extended by new metric circuit 954B.

In some embodiments, configurator may automatically select a new metric circuit once expiry of a first metric circuit is determined for applications requiring long license durations that may extend beyond the resolution capability of a single metric circuit.

Alternatively, the configurator may alternatively structure new metric circuits responsive to receipt of a license renew request. In other embodiments, a license may be renewed by adjusting the threshold levels used by the comparator logic.

In further examples, a calibrator may determine the degradation rates of each of the individual metric circuits. The configurator may then tailor selection of metric circuits based upon a determined license duration and the predetermined calibration data for the metric circuits.

Figure 10:
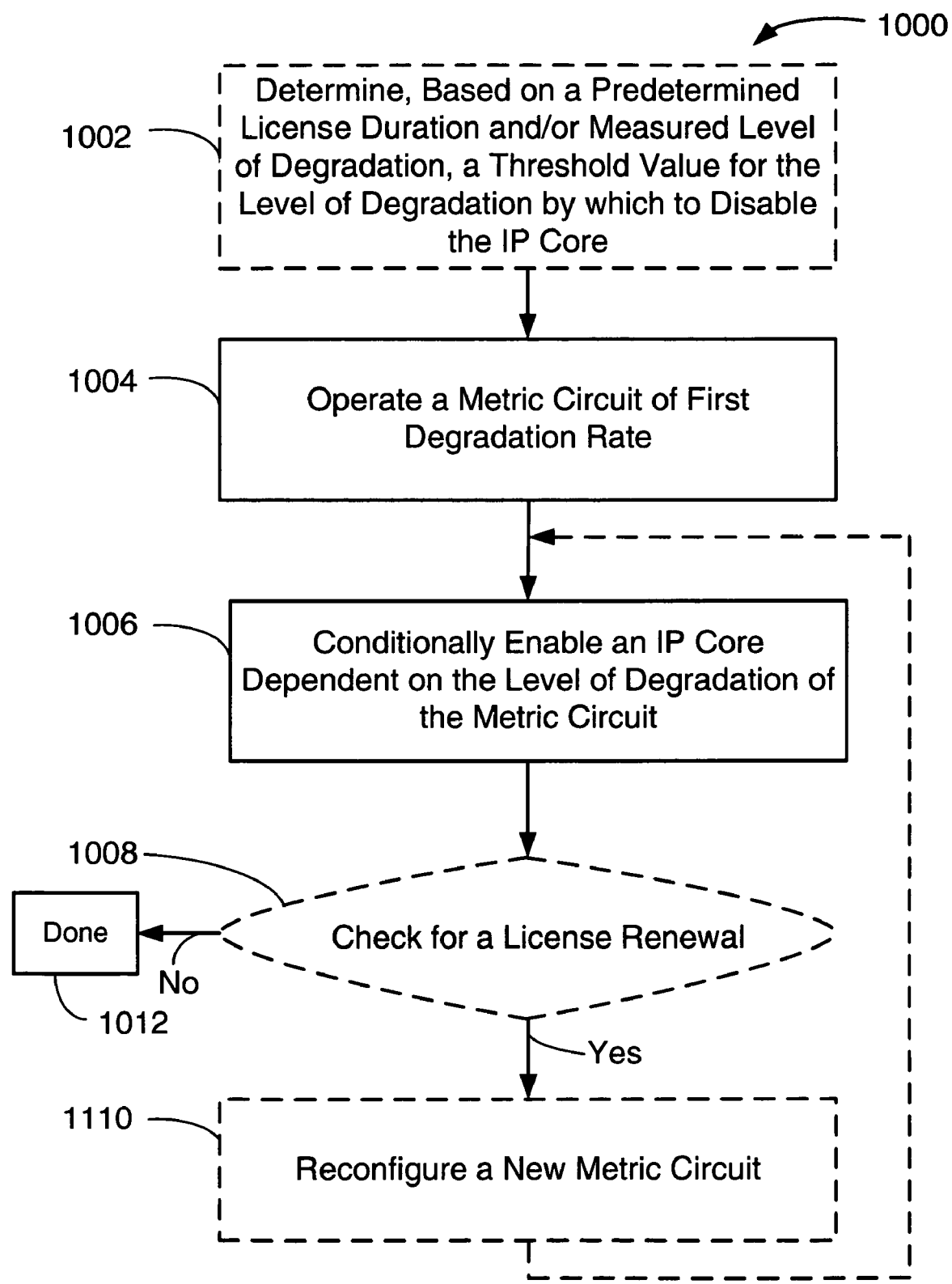
FIG. 10 is a simplified flow chart representative of a method of operating a programmable logic device for enforcing a time-limited license to an IP core in accordance with an embodiment of the present invention.

In a method of operation, referencing FIGS. 9A, 9B, and 10, a programmable logic device may operate a metric circuit of a first degradation rate (Block 1004 of FIG. 10). Based on the level of degradation of the metric circuit as may be determined by controller 952, an IP core 972 may be conditionally operated (Block 1006 of FIG. 10). In a further provision, the threshold value for the level of degradation by which to disable the IP core may be previously determined (Block 1002 of FIG. 10) based on a predetermined license duration for the IP core 972. Once controller 952 determines a level of degradation of metric circuit 954A that exceeds a given threshold, controller 952 may drive output 666 for disabling the licensed IP core 972.

In a further aspect, a configurator may wait for determining a license renewal (Block 1008 of FIG. 10). In the absence of license renewal, further operation of the IP core 972 may be terminated (Block 1012 of FIG. 10). If a request for license renewal is received, a configurator of the programmable logic device 900 may reconfigure (Block 1010 of FIG. 10) the controller 901 for monitoring a new metric circuit 754B (FIG. 9B) and by which to control further operability of the licensed IP core 972.

In another embodiment, determining the setting for the duration of operation 1002 comprises first measuring the output of the vulnerable circuit, then setting the limiting level of degradation. In yet another embodiment, choosing the setting for the duration of operation comprises measuring the output of the vulnerable circuit at two or more times to determine the rate of degradation or the shape of the degradation curve. In these embodiments, manufacturing variations can be overcome in the setting of the time limit. They also provide a convenient mechanism for implementing license renewal.

In another embodiment, rather than apply stress continuously to the vulnerable circuit, stress may be applied only at certain times, such as when power is initially supplied or upon initialization of the IP core. In this embodiment, a core can be limited to a number of uses, rather than a specific duration.

The various embodiments described above are provided by way of illustration only and should not be construed to limit the invention. Based on the above discussion and illustrations, those skilled in the art will recognize that various modifications and changes may be made to the present invention without strictly following the exemplary embodiments and applications illustrated and described herein. Such modifications and changes do not depart from the true spirit and scope of the present invention as may be set forth in the following claims.

What is claimed is:

1. A programmable logic device comprising:
 a weakened circuit operable to perform a function and emit a first signal dependent upon age of the weakened circuit;
 a comparator to compare the first signal to a predetermined reference signal and emit a second signal based upon the comparison; and
 a controller to selectively disable at least a portion of the device dependent on the second signal.

2. The device of claim 1, wherein the weakened circuit comprises at least one vulnerable element configured to receive stress for accelerated degradation relative to other operable elements of the programmable logic device;
 the vulnerable element to impart at least one of a propagation delay and a decreased voltage to affect operation of the weakened circuit by magnitude dependent on a level of degradation of the vulnerable element.

3. The device of claim 2, wherein the weakened circuit comprises a counter operable to count at a rate dependent on the age of the counter; and
 the comparator is operable to compare at least one of a duration required for the counter to obtain a predefined count relative to a reference duration and a count of the counter obtained over a predefined duration relative to a reference count.

4. The device of claim 3, wherein the counter comprises an oscillator to advance counts of the counter, the oscillator defined in part by the vulnerable element and operable with an oscillation frequency dependent on the propagation delay of the vulnerable element.

5. The device of claim 4, wherein the vulnerable element comprises at least one of the group consisting of a transistor, a metal trace, a dielectric, a capacitor, and a resistor formed by a first set of design rules predetermined to enhance stress vulnerability,
 and wherein other elements of the programmable logic device are formed by a second set of design rules different from the first set of design rules.

6. The device of claim 2, further comprising bias circuitry to operate the vulnerable element with at least one of an increased current, increased voltage, increased temperature, and constant biasing to accelerate degradation during the operation of the programmable logic device.

7. The device of clam 1, further comprising a programmable register to source the reference signal to the comparator; and
 a configurator to load the programmable register with reference data predetermined to generate the reference signal.

8. The device of claim 7, wherein the configurator is further operable to receive configuration data and to configure programmable resources of the programmable logic device to realize an IP core as defined by at least a portion of the configuration data;
 the configurator further operable to parse a license duration from the configuration data, and to determine the reference value to be programmed into the programmable register based on the license duration obtained.

9. The device of claim 8, wherein the weakened circuit comprises a plurality of counters, each of the plurality selectively and individually operable to count at a rate dependent on its individual operative age; and
 wherein the configurator is further operable responsive to a license renewal request to select a new counter of the plurality from which to source counts as the first signal to the comparator.

10. The device of claim 1, wherein the weakened circuit comprises a vulnerable element subject to first degradation rate with respect to time and affecting the repeated performance of the function based on the degradation of the vulnerable element; the device further comprising a reference circuit corresponding to the weakened circuit but having a non-vulnerable element in the place of the vulnerable element of second degradation rate that is less than the first degradation rate, and operable to produce the predetermined reference signal.

11. A method of operating a programmable logic device comprising:
 operating a weakened metric circuit of a degradation rate, and
 conditionally disabling at least a portion of the programmable logic device dependent upon a degradation of the metric circuit.

12. The method of claim 11, wherein operating the weakened metric circuit comprises applying at least one of an increased voltage, an increased current, and an increased temperature to at least a portion of the metric circuit to stress the portion and affect the degradation rate of the metric circuit.

13. The method of claim 12, wherein the applying comprises applying the at least one of the increased voltage, the increased current, and the increased temperature discontinuously; and
 wherein the conditionally disabling is dependent upon a number of times the at least one of the increased voltage, the increased current, and the increased temperature is applied.

14. The method of claim 11, wherein the operating comprises enabling a counter as the metric circuit to count a sequence within a duration, the counting dependent on a level of degradation of the counter; and checking an age of the logic element based on at least one of a count obtained by the counter over a predetermined reference duration and the duration required by the counter to reach a predetermined reference count;

the conditionally disabling to be based on the checking.

15. The method of claim 14, further comprising:

obtaining a licensed duration value; and determining a reference value based on the licensed duration obtained;

the checking the age comprising comparing the at least one of the count obtained and the duration required to the reference value; and the conditionally disabling to be based on the comparing.

16. The method of claim 15, further comprising:

configuring an IP core of the programmable logic device in accordance with configuration data for the IP core;

wherein if source data for the configuration data for the IP core is encrypted, the configuring to further comprise decrypting the source data based on a predetermined decryption key to recover the configuration data for the IP core; and the obtaining the licensed duration value comprising parsing the configuration data for the IP core to recover the value for the licensed duration.

17. The method of claim 16, further comprising:

determining degradation rate of the counter; and the determining the reference value to be further based on the degradation rate determined and the value for licensed duration parsed from the configuration data.

18. A system comprising:

an IP core selectively operable to perform a predefined function;

a weakened metric circuit, the metric circuit to produce a signal having a quantifiable trait dependent on aging of the metric circuit; and a controller to determine if the trait of the signal produced by the metric circuit exceeds a predetermined threshold, the controller further operable to control enablement of the IP core dependent on the determination.

19. The system of claim 18, further comprising a configurator operable to determine a licensed time-limit for operability of the IP core and to obtain the predetermined threshold based on the licensed time-limit determined.

20. The system of claim 19, further comprising:

a calibrator to determine changes in the quantifiable trait of the signal produced by the metric circuit with respect to time and to define a rate of degradation for the metric circuit based on the determination;

the configurator further operable to obtain the predetermined threshold based upon the rate of degradation defined in combination with the licensed time-limit determined.

\* \* \* \* \*